United States Patent
Byun et al.

(10) Patent No.: US 9,769,964 B2
(45) Date of Patent: Sep. 19, 2017

(54) HEAT DISCHARGING SHEET AND DISPLAY DEVICE INCLUDING THE SAME

(71) Applicant: LG ELECTRONICS INC., Seoul (KR)

(72) Inventors: Nami Byun, Seoul (KR); Dongwook Lee, Seoul (KR); Taehyeong Kim, Seoul (KR); Sungguk Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 177 days.

(21) Appl. No.: 14/142,493

(22) Filed: Dec. 27, 2013

(65) Prior Publication Data

US 2014/0204535 A1 Jul. 24, 2014

(30) Foreign Application Priority Data

Jan. 18, 2013 (KR) .................. 10-2013-0005836

(51) Int. Cl.
*H05K 7/20* (2006.01)
*H01L 23/373* (2006.01)

(52) U.S. Cl.
CPC ....... *H05K 7/20963* (2013.01); *H01L 23/373* (2013.01); *H01L 23/3735* (2013.01); *H01L 23/3737* (2013.01); *H01L 23/3733* (2013.01); *H01L 2924/0002* (2013.01)

(58) Field of Classification Search
CPC .................................. H05K 7/20963
See application file for complete search history.

(56) References Cited

U.S. PATENT DOCUMENTS

| | | | | |
|---|---|---|---|---|
| 7,102,285 B2 * | 9/2006 | Chen | ............ | B82Y 10/00 313/46 |
| 7,160,619 B2 * | 1/2007 | Clovesko | ............ | B32B 9/00 361/704 |
| 7,176,605 B2 * | 2/2007 | Bae | ............ | H05K 7/20963 313/46 |
| 7,276,273 B2 * | 10/2007 | Clovesko | ............ | B32B 9/00 361/704 |
| 7,292,440 B2 * | 11/2007 | Cho | ............ | H05K 7/20963 165/185 |
| 7,315,451 B2 * | 1/2008 | Kim | ............ | H05K 7/20963 313/46 |

(Continued)

FOREIGN PATENT DOCUMENTS

| CN | 1770225 A | 5/2006 |
|---|---|---|
| CN | 1801256 A | 7/2006 |

(Continued)

*Primary Examiner* — Robert J Hoffberg
(74) *Attorney, Agent, or Firm* — Birch, Stewart, Kolasch & Birch, LLP

(57) ABSTRACT

Disclosed is a heat discharging sheet. More specifically, disclosed is a heat discharging sheet and a display device including the same. The heat discharging sheet includes a heat discharging layer having a first surface and a second surface, an adhesive layer disposed on the first surface of the heat discharging layer, the adhesive layer being bonded to the heat source and including a thermal conductivity enhancing material, and a protective layer disposed on the second surface of the heat discharging layer, the protective layer including a thermal conductivity enhancing material.

19 Claims, 4 Drawing Sheets

(56) References Cited

U.S. PATENT DOCUMENTS

| | | | |
|---|---|---|---|
| 7,385,819 B1 * | 6/2008 | Shives | H05K 7/20963 349/58 |
| 7,495,918 B2 * | 2/2009 | Lee | H05K 7/20963 165/104.33 |
| 7,679,285 B2 * | 3/2010 | Kim | H05K 7/20963 313/45 |
| 9,081,220 B2 * | 7/2015 | Shives | G02F 1/133308 |
| 9,087,669 B2 * | 7/2015 | Shives | G02F 1/133385 |
| 9,363,932 B2 * | 6/2016 | Wang | H05K 7/20963 |
| 2006/0133046 A1 | 6/2006 | Kim et al. | |
| 2006/0152905 A1 * | 7/2006 | Kim | H05K 5/02 361/715 |
| 2007/0053168 A1 * | 3/2007 | Sayir | B32B 18/00 361/718 |
| 2008/0186419 A1 * | 8/2008 | Kim | H05K 7/20963 349/32 |
| 2008/0203880 A1 * | 8/2008 | Kim | H05K 7/20963 313/45 |
| 2011/0151201 A1 * | 6/2011 | Lee | G06F 3/044 428/192 |
| 2013/0114290 A1 | 5/2013 | Lee | |
| 2013/0329366 A1 * | 12/2013 | Wang | H05K 7/20963 361/704 |
| 2015/0086743 A1 * | 3/2015 | Lee | C09J 9/02 428/41.8 |
| 2015/0313038 A1 * | 10/2015 | Shives | G02F 1/133308 361/709 |
| 2015/0313043 A1 * | 10/2015 | Shives | G02F 1/133385 445/24 |

FOREIGN PATENT DOCUMENTS

| | | | |
|---|---|---|---|
| CN | 102461954 A | 5/2012 | |
| CN | 102509523 A | 6/2012 | |
| CN | 102555314 A | 7/2012 | |
| CN | 102555321 A | 7/2012 | |
| CN | 102555324 A | 7/2012 | |
| CN | 202565640 U | 11/2012 | |
| KR | 100554097 B1 * | 2/2006 | |
| KR | 20110108055 A * | 10/2011 | B32B 7/12 |
| KR | WO 2013183882 A1 * | 12/2013 | C09J 9/02 |

* cited by examiner

HEAT DISCHARGING SHEET AND DISPLAY DEVICE INCLUDING THE SAME

This application claims the benefit of Korean Patent Application No. 10-2013-0005836, filed on Jan. 18, 2013, which is hereby incorporated by reference as if fully set forth herein.

BACKGROUND OF THE INVENTION

Field of the Invention

The present invention relates to a heat discharging sheet and more specifically, to a heat discharging sheet and a display device including the same.

Discussion of the Related Art

Substances containing carbon atoms include fullerene, carbon nanotube, graphene and graphite. Of these, graphene is a single atom layer whose structure is a two-dimensional planar array of carbon atoms.

In particular, graphene has considerably stable and superior electrical, mechanical and chemical properties and has excellent conductivity and thus more rapidly carries electrons than silicon and enables application of higher electrical current than copper, which has been actively researched since it was demonstrated through experimentation based on discovery of a method of separating graphene from graphite in 2004.

Such graphene attracts much attention as a base material for electrical circuits because it may be produced over large areas and has electrical, mechanical, chemical stability as well as excellent conductivity.

In addition, electrical properties of graphene may change according to crystal direction of graphene with a predetermined thickness. For this reason, electrical properties are expressed in a direction selected by a user and devices can be thus easily designed. Accordingly, graphene is effectively used for carbon-based electronic or electromagnetic devices.

As such, graphene may be applied to heat discharge materials due to superior thermal conductivity.

SUMMARY OF THE INVENTION

Accordingly, the present invention is directed to a heat discharging sheet and a display device including the same that substantially obviate one or more problems due to limitations and disadvantages of the related art.

An object of the present invention is to provide a heat discharging sheet to effectively transfer and discharge heat generated by a heat source and a display device including the heat discharging sheet.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a heat discharging sheet includes a heat discharging layer having a first surface and a second surface, an adhesive layer disposed on the first surface of the heat discharging layer, the adhesive layer being bonded to the heat source and including a thermal conductivity enhancing material, and a protective layer disposed on the second surface of the heat discharging layer, the protective layer including a thermal conductivity enhancing material.

In accordance with another aspect of the present invention, a heat discharging sheet includes a heat discharging layer having a first surface and a second surface, an adhesive layer disposed on the first surface of the heat discharging layer, the adhesive layer being bonded to the heat source, and a protective layer disposed on the second surface of the heat discharging layer, wherein at least one of the adhesive layer and the protective layer includes at least one of a thermal conductivity enhancing material or graphene.

In accordance with another aspect of the present invention, a display device having a heat discharging sheet includes a driving chip, a metal frame disposed on the driving chip, a display disposed on the metal frame, and a heat discharging sheet disposed between the metal frame and the display.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide further understanding of the disclosure and are incorporated in and constitute a part of this application, illustrate embodiments of the disclosure and together with the description serve to explain the principle of the disclosure. In the drawings.

DETAILED DESCRIPTION OF THE INVENTION

Reference will now be made in detail to the specific embodiments of the present invention, examples of which are illustrated in the accompanying drawings.

However, the present invention allows various modifications and variations and specific embodiments thereof are described in drawings and will be described in detail. The present invention should not be construed as limited to the embodiments set forth herein and includes modifications, variations, equivalents, and substitutions compliant with the spirit or scope of the present invention defined by the appended claims.

It will be understood that when an element such as a layer, area, or substrate is referred to as being "on" another element, it can be directly on the element, or one or more intervening elements may also be present.

In addition, it will be understood that although terms such as "first" and "second" may be used herein to describe elements, components, areas, layers and/or regions, the elements, components, areas, layers and/or regions should not be limited by these terms.

Figure 1:
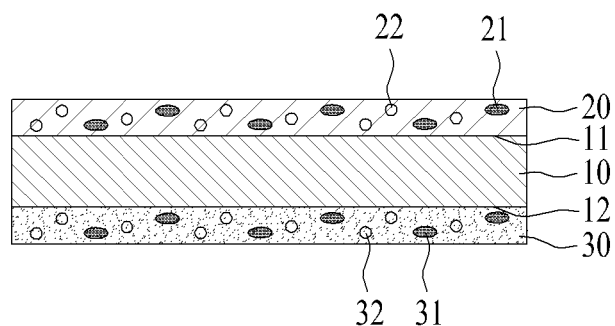
FIG. 1 is a sectional view illustrating an example of a heat discharging sheet using graphene.

FIG. 1 is a sectional view illustrating an example of a heat discharging sheet. As shown in FIG. 1, a heat discharging sheet 100 is provided with a heat discharging layer 10 having a first surface 12 and a second surface 11. The heat discharging layer 10 transfers or discharges heat.

An adhesive layer 30 bonded to a heat source 200 (see FIG. 3) is disposed on the first surface 12 of the heat discharging layer 10.

In addition, a protective layer 20 to protect the heat discharging layer 10 is disposed on the second surface 11 of the heat discharging layer 10.

The adhesive layer 30 may contain a graphene 31. In addition, the adhesive layer 30 may contain a thermal conductivity enhancing material 32. That is, the adhesive layer 30 may contain at least one of the graphene 31 and the thermal conductivity enhancing material 32.

At least one of the graphene 31 and the thermal conductivity enhancing material 32 contained in the adhesive layer 30 improves conductivity of heat via the adhesive layer 30.

Accordingly, the adhesive layer 30 functions transfer heat while improving adhesion to the heat source and minimizing the distance with the heat source.

A polymer may be used as a base material for the adhesive layer 30, but the present invention is not limited thereto.

Examples of the polymer used as the base material for the adhesive layer 30 include polyurethane resins, epoxy resins, acrylic resins and a variety of polymer resins.

As described above, the adhesive layer 30 contains at least one of the graphene 31 and the thermal conductivity enhancing material 32 and thus more effectively transfers heat generated by the heat source to the heat discharging layer 10.

The thermal conductivity enhancing material 32 may include at least one of metals, inorganic substances and carbon materials.

More specifically, the thermal conductivity enhancing material 32 may include at least one of Cu, Al, BN, AlN, $Al_2O_3$, MgO, graphite and carbon nanotube (CNT).

Meanwhile, when the graphene 31 is contained in the adhesive layer 30, the graphene 31 is mixed in an amount of 10 to 90 wt % with the polymer material.

In addition, the thermal conductivity enhancing material 32 may be mixed in an amount of 10 to 90 wt % with the polymer material.

Here, the adhesive layer 30 may have a thickness of several tens of nm to several hundreds of μm and may have a thickness of 5 to 20 μm for effective discharge of heat and adhesion to the heat source.

More specifically, the adhesive layer 30 exerts optimum effects when it has a thickness of 5 to 20 μm.

The protective layer 20 may contain a graphene 21. In addition, the protective layer 20 may contain a thermal conductivity enhancing material 22. That is, the protective layer 20 may contain at least one of the graphene 21 and the thermal conductivity enhancing material 22.

At least one of the graphene 21 and the thermal conductivity enhancing material 22 contained in the protective layer 20 improves conductivity of heat via the protective layer 20.

Accordingly, the graphene 21 or the thermal conductivity enhancing material 22 discharges or exchanges heat through the protective layer 20.

Meanwhile, the protective layer 20 may be coated on the heat discharging layer 10 so as to prevent detachment of material for the heat discharging layer 10. However, the protective layer 20 also improves insulation or heat discharge property.

A polymer substance may be used as a material for the protective layer 20, but the present invention is not limited thereto.

Examples of the polymer substance used for the protective layer 20 include polyurethane resins, epoxy resins, acrylic resins and a variety of polymer resins such as PET.

Meanwhile, the protective layer 20 may have a thickness of several tens of nanometers to several hundreds of micrometers in consideration of protection of the heat discharging layer 10 and discharge of heat to the outside and may have a thickness of 5 to 100 μm in order to effectively discharge heat and effectively bond the heat discharging layer 10 to the heat source.

More specifically, the protective layer 20 exerts optimum effects when it has a thickness of 5 to 20 μm.

As described above, the protective layer 20 may contain the graphene 21 or the thermal conductivity enhancing material 22. In addition, when the protective layer 20 is formed using a polymer material, the graphene 21 is mixed in an amount of 10 to 90 wt % with the polymer material for the protecting layer.

In addition, the thermal conductivity enhancing material 22 may be mixed in an amount of 10 to 90 wt % with the polymer material.

Meanwhile, the heat discharging layer 10 is bonded to the heat source through the adhesive layer 30 and discharges heat and in particular, discharges transferred heat mainly in a lateral direction.

The heat discharging layer 10 may contain at least one of graphene, a metal and graphite. That is, the heat discharging layer 10 containing at least one of graphene, a metal and graphite may be configured to discharges heat in a lateral direction.

Figure 2:
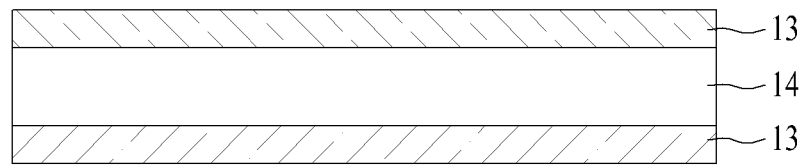
FIG. 2 is a sectional view illustrating an example of forming graphene.

The graphene which may be contained in the heat discharging layer 10, the protective layer 20 or the adhesive layer 30 may be produced by forming the graphene layer 13 on a catalyst metal layer 14, as shown in FIG. 2.

The heat discharging layer 10 may be produced by laminating the graphene layer 13 to a predetermined thickness. The thickness of the heat discharging layer 10 may be 5 to 100 μm and the graphene layer 13 may be laminated to the thickness to constitute the heat discharging layer 10.

The graphene has a high thermal conductivity of about 3,000 to about 5,000 W/mK, thus effectively discharging heat transferred from the heat source through the heat discharging layer 10 and in particular, in a lateral direction.

Meanwhile, the graphene may be produced by reducing graphene oxide.

Graphene oxide is a carbon particle oxidized with an acid. Graphene oxide may be produced by oxidizing graphite with a strong acid such as sulfuric acid. If necessary, a mixture of sulfuric acid with oxygenated water may be used for oxidization.

Graphite has a sheet structure and is oxidized when a strong acid is added thereto. Graphene oxide is obtained by chemically making such graphite into small particles.

The graphene oxide effectively transfers heat generated by the heat source because it has non-conductivity not allowing flow of electricity and thermal conductivity of W/mK.

As described above, the graphene oxide may be produced into graphene by reduction and the graphene is added to the heat discharging layer 10, the protective layer 20 or the adhesive layer 30.

Figure 3:
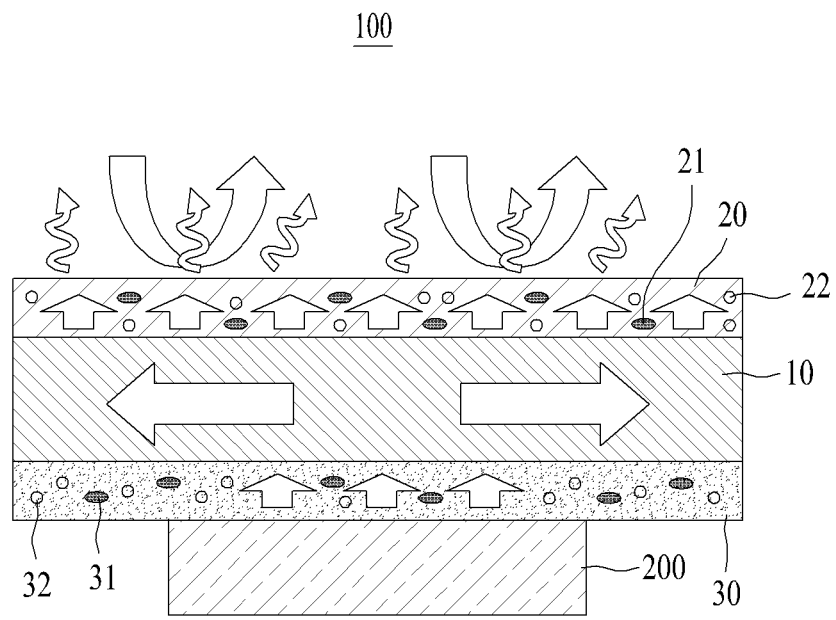
FIG. 3 is a schematic view illustrating discharge of heat by the heat discharging sheet bonded to a heat source.

FIG. 3 is a schematic view illustrating discharge of heat by the heat discharging sheet bonded to the heat source.

As described above, the heat discharging sheet 100 is bonded to the heat source 200 to effectively discharge heat generated by the heat source 200.

The heat discharging layer 10 is bonded to the heat source 200 to discharge heat generated by the heat source 200. In this case, the adhesive layer 30 is bonded to the heat source 200 to effectively transfer heat generated by the heat source 200 to the heat discharging layer 10.

When the adhesive layer 30 contains at least one of the graphene 31 and the thermal conductivity enhancing material 32, heat generated by the heat source 200 can be more effectively transferred to the heat discharging layer 10 due to superior thermal conductivity of the graphene 31 or the thermal conductivity enhancing material 32.

The heat discharging layer 10 more effectively discharges heat generated by the heat source 200 because it discharges the heat in a lateral direction.

The heat transferred to the protective layer 20 can be discharged to the outside through the protective layer 20. In addition, when the protective layer 20 contains at least one of the graphene 21 and the thermal conductivity enhancing material 22, heat can be effectively discharged through the protective layer 20 due to superior thermal conductivity of the graphene 21 or the thermal conductivity enhancing material 22.

In addition, heat exchange with the air may also occur through the protective layer 20.

Commonly, the protective layer 20 and the adhesive layer 30 may contain an oxide filler so as to improve thermal conductivity. However, the oxide filler should be added in a high amount so as to improve thermal conductivity to a desired level due to high weight and low thermal conductivity, thus being unsuitable for use in products having a thickness of several to several tens of micrometers.

However, the protective layer 20 or the adhesive layer 30 containing at least one of the graphenes 21 and 31 and the thermal conductivity enhancing materials 22 and 32 can more effectively transfer or discharge heat without causing such a problem.

Figure 4:
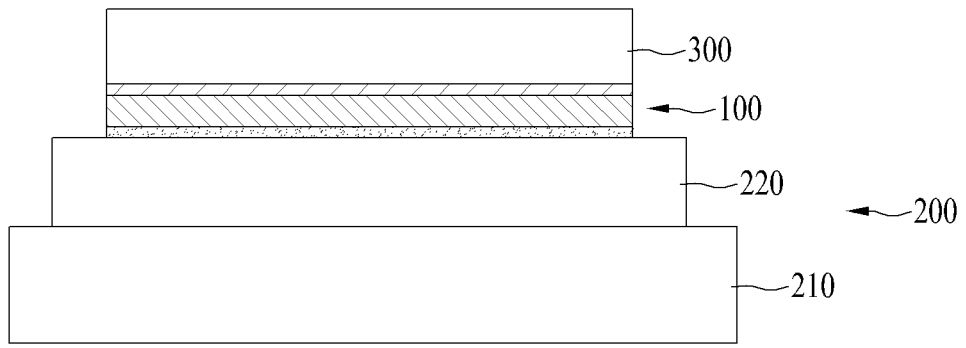
FIG. 4 shows an example of a display device using the heat discharging sheet.

FIG. 4 shows a product including a display device such as a cellular phone employing the heat discharging sheet 100 as an example of using the heat discharging sheet.

FIG. 4 shows a configuration in which a heat discharging sheet 100 is bonded to a heat source 200 including a driving chip 210 and a metal frame 220 disposed on the driving chip 210 and a display 300 is disposed on the heat discharging sheet 100.

The driving chip 210 may be a chip for driving the cellular phone or a semiconductor chip for driving the display 300.

The metal frame 220 disposed on the driving chip 210 may be an aluminum or SUS frame 220.

The metal frame 220 does not effectively dissipate heat generated by the driving chip 210 in a horizontal direction and transfers heat in a proceeding direction. Accordingly, heat transferred from the metal frame 220 spreads and discharges in a horizontal direction through the heat discharging sheet 100.

That is, heat is transferred from the metal frame 220 to the heat discharging layer 10 through the adhesive layer 30 of the heat discharging sheet 100 and the heat discharging layer 10 discharges the heat to the outside while spreading in the lateral direction.

In the configuration shown in FIG. 4, the heat discharging sheet 100 discharges heat in the lateral direction rather than toward the display 300.

In this case, heat discharged from the display 300 is also transferred to the heat discharging layer 10 through the protective layer 20 and is then discharged.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A heat discharging sheet comprising:
   a heat discharging layer having a first surface and a second surface opposite to the first surface, wherein the heat discharging layer comprises at least one of graphene or graphite;
   an adhesive layer disposed on the first surface of the heat discharging layer, the adhesive layer being bonded to a heat source and comprising a thermal conductivity enhancing material, wherein the thermal conductivity enhancing material includes at least one of Cu, Al, BN, AlN, $Al_2O_3$, MgO, graphite or a carbon nanotube, wherein the adhesive layer includes a polymer as a base material; and
   a protective layer disposed on the second surface of the heat discharging layer, the protective layer comprising a thermal conductivity enhancing material and graphene,
   wherein each of the adhesive layer and the protective layer has a thickness different from that of the heat discharging layer, and
   wherein the protective layer is disposed on the heat discharging layer so as to prevent detachment of material for the heat discharging layer.

2. The heat discharging sheet according to claim 1, wherein the adhesive layer further comprises graphene.

3. The heat discharging sheet according to claim 2, wherein the graphene included in the adhesive layer is mixed in an amount of 10 to 90 wt % with the polymer material constituting the adhesive layer.

4. The heat discharging sheet according to claim 1, wherein at least one of the adhesive layer or the protective layer has a thickness of 5 to 20 μm.

5. The heat discharging sheet according to claim 1, wherein the protective layer further comprises at least one of polyurethane resins, epoxy resins, acrylic resins or PET.

6. The heat discharging sheet according to claim 1, wherein when the heat discharge layer includes the graphene, the graphene is disposed so as to discharge heat in a lateral direction of the heat discharging layer.

7. The heat discharging sheet according to claim 1, wherein the protective layer is disposed such that a heat transferred to the protective layer through the heat discharging layer is discharged to an outside through the protective layer.

8. A heat discharging sheet comprising:
   a heat discharging layer having a first surface and a second surface opposite to the first surface, wherein the heat discharging layer comprises at least one of graphene or graphite;
   an adhesive layer disposed on the first surface of the heat discharging layer, the adhesive layer being bonded to a heat source, wherein the adhesive layer includes a polymer as a base material; and
   a protective layer disposed on the second surface of the heat discharging layer, wherein the protective layer includes at least one of polyurethane resins, epoxy resins, acrylic resins or PET,
   wherein the adhesive layer comprises a thermal conductivity enhancing material and graphene,
   wherein the protective layer comprises a thermal conductivity enhancing material and graphene, wherein each of the adhesive layer and the protective layer has a thickness different from that of the heat discharging layer, and wherein the protective layer is disposed on the heat discharging layer so as to prevent detachment of material for the heat discharging layer.

9. The heat discharging sheet according to claim 8, wherein the thermal conductivity enhancing material comprised in the adhesive layer comprises at least one of a metal, an inorganic substance or a carbon material.

10. The heat discharging sheet according to claim 8, wherein the thermal conductivity enhancing material comprised in the adhesive layer comprises at least one of Cu, Al, BN, AlN, $Al_2O_3$, MgO, graphite or a, carbon nanotube.

11. The heat discharging sheet according to claim 8, wherein at least one of the adhesive layer and the protective layer has a thickness of 5 to 20 μm.

12. The heat discharging sheet according to claim 8, wherein the heat discharging layer further comprises a metal.

13. The heat discharging sheet according to claim 8, wherein the protective layer is disposed such that a heat transferred to the protective layer through the heat discharging layer is discharged to an outside through the protective layer.

14. A display device having a heat discharging sheet comprising:

a driving chip;

a metal frame disposed on the driving chip; and a display disposed on the metal frame, wherein the heat discharging sheet is disposed between the metal frame and the display, wherein the heat discharging sheet includes:

a heat discharging layer having a first surface and a second surface opposite to the first surface, wherein the heat discharging layer comprises at least one of graphene or graphite;

an adhesive layer disposed on the first surface of the heat discharging layer, the adhesive layer being bonded to the metal frame, and comprising a thermal conductivity enhancing material including at least one of Cu, Al, BN, AlN, $Al_2O_3$, MgO, graphite or a carbon nanotube, wherein the adhesive layer includes a polymer as a base material; and a protective layer disposed on the second surface of the heat discharging layer, wherein the protective layer comprises at least one of a thermal conductivity enhancing material or graphene, wherein each of the adhesive layer and the protective layer has a thickness different from that of the heat discharging layer, and wherein the protective layer is disposed on the heat discharging layer so as to prevent detachment of material for the heat discharging layer.

15. The display device according to claim 14, wherein when the protective layer includes the graphene, the graphene is mixed in an amount of 10 to 90 wt % with the polymer material constituting the protective layer.

16. The display device according to claim 14, wherein at least one of the adhesive layer or the protective layer has a thickness of 5 to 20 μm.

17. The display device according to claim 14, wherein the heat discharging layer further comprises a metal.

18. The display device according to claim 14, wherein the protective layer includes at least one of polyurethane resins, epoxy resins, acrylic resins or PET.

19. The display device according to claim 14, wherein the protective layer is disposed such that a heat transferred to the protective layer through the heat discharging layer is discharged to an outside through the protective layer.

* * * * *